(12) United States Patent
Su et al.

(10) Patent No.: US 8,872,170 B2
(45) Date of Patent: Oct. 28, 2014

(54) IMAGE DISPLAY SYSTEM

(71) Applicant: InnoLux Corporation, Miao-Li County (TW)

(72) Inventors: Hsin-Yuan Su, Miao-Li County (TW); Chun-kai Li, Miao-Li County (TW); Hsiang-Lun Hsu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 13/804,712

(22) Filed: Mar. 14, 2013

(65) Prior Publication Data

US 2013/0277648 A1 Oct. 24, 2013

(30) Foreign Application Priority Data

Apr. 19, 2012 (TW) .............................. 101113902 A

(51) Int. Cl.
*H01L 51/50* (2006.01)
(52) U.S. Cl.
CPC ................................. *H01L 51/5012* (2013.01)
USPC ........................ 257/40; 257/98; 257/E51.018

(58) Field of Classification Search
USPC .......................... 257/40, 98, E51.018; 438/26
See application file for complete search history.

(56) References Cited

U.S. PATENT DOCUMENTS

| 5,674,636 | A  | * | 10/1997 | Dodabalapur et al. | ........ | 428/690 |
| 6,831,409 | B2 | * | 12/2004 | Yamada | ........................ | 313/506 |
| 7,208,863 | B2 | * | 4/2007  | Strip | .............................. | 313/112 |
| 2011/0150019 | A1 | * | 6/2011 | Leatherdale et al. | ...... | 372/45.01 |
| 2011/0303905 | A1 | * | 12/2011 | Gather et al. | .................. | 257/40 |

* cited by examiner

*Primary Examiner* — Roy Potter
(74) *Attorney, Agent, or Firm* — McClure, Qualey & Rodack, LLP

(57) ABSTRACT

An image display system employing an organic electroluminescent device is provided. The organic electroluminescent device includes a substrate; a first electrode formed on the substrate; a first emitting layer formed on the first electrode, wherein the first emitting layer emits a first color of light, and a second color of light; a second electrode formed on the first emitting layer, wherein the second color of light emitted by the first emitting layer generates a first standing wave within the organic electroluminescent device, and the first emitting layer is disposed at an antinode of the first standing wave, such that the intensity of the second color of light is enhanced, and the second color of light is mixed with the first color of light to produce a white emission.

18 Claims, 7 Drawing Sheets

IMAGE DISPLAY SYSTEM

CROSS REFERENCE TO RELATED APPLICATIONS

This application is based upon and claims the benefit of priority from the prior Taiwan Patent Application No. 101113902, filed on Apr. 19, 2012, the entire contents of which are incorporated herein by reference.

BACKGROUND

1. Technical Field

The present invention relates to an image display system, and in particular relates to an image display system having an organic electroluminescent device.

2. Description of the Related Art

Recently, with the development and wide application of electronic products, such as mobile phones, and notebook computers, there have been increasing demands for flat display elements which consume less power and occupy less space. Organic electroluminescent diodes are popular for use in flat panel displays as they are self-emitting and highly luminous, provide wide viewing angles, have a fast response speed, and a simple fabrication process.

An organic electroluminescent diode is an LED that uses an organic layer as the active layer. In recent years, organic electroluminescent diodes have been gradually applied in flat panel displays. One trend in organic electroluminescent diode technology is to achieve high luminescent efficiency and long operating lifetimes.

Several methods have been employed to achieve full color emission in organic electroluminescent devices. In general, there is a major tendency to fabricate full color organic electroluminescent devices by a method of RGB emitting layers or a color changing method. Among these methods, the so-called "color changing method" indicates that white organic electroluminescent diodes are formed respectively on corresponding red, green and blue color filters, and then driven by bias voltages to emit red, green and blue respectively.

In the direct full-color display technique, there is a tendency to fabricate full color organic electroluminescent devices by a method of RGB emitting layers. The so-called method of RGB emitting layers indicates that red, green and blue color arrays are formed, and then driven by bias voltages to emit red, green and blue, respectively. The individual aging rates of RGB organic electroluminescent materials, however, are different and lead to color deterioration of the organic electroluminescent device after a period of time.

Accordingly, a full-color organic electroluminescent device with a color filter has been developed to solve the problems caused by the above full-color organic electroluminescent devices. In particular, white light emitted from a white organic light emitting diode is converted to RGB by passing through the RGB color filters. Nevertheless, since the RGB emission spectrum of the white organic electroluminescent device does not precisely correspond to the RGB transmission spectrum of RGB color filters, the spectral FWHM (full width at half maximum) of the filtered RGB luminescence is enlarged and reduced, such that color saturation (NTSC ratio) of the full-color display employing the white organic electroluminescent device and RGB color filters is reduced, limiting the color range thereof.

Therefore, it is necessary to develop a simple and efficient manufacturing method and structure for a full-color organic electroluminescent device.

SUMMARY

An exemplary embodiment of the invention provides an image display system including an organic electroluminescent device. The organic electroluminescent device includes: a substrate; a first electrode formed on the substrate; a first emitting layer formed on the first electrode, wherein the first emitting layer emits a first color of light, and a second color of light; a second electrode formed on the first emitting layer, wherein the second color of light emitted by the first emitting layer generates a first standing wave within the organic electroluminescent device, and the first emitting layer is disposed at an antinode of the first standing wave, such that the intensity of the second color of light is enhanced, and the second color of light is mixed with the first color of light to produce a white emission.

Another exemplary embodiment of the invention provides an image display system including an organic electroluminescent device. The organic electroluminescent device includes a substrate; a first electrode formed on the substrate; a first hole injection layer, a first hole transport layer, a first emitting layer, a first spacer layer, a second emitting layer, a second spacer layer, a third emitting layer, a first electron transport layer, and a first electron injection layer sequentially formed on the first electrode, wherein the first emitting layer, the second emitting layer, and the third emitting layer are formed by the same material, and each emitting layer emits a first color, a second color, and a third color of light; a second electrode formed on the first electron injection layer, wherein the second color of light emitted by each emitting layer generates a first standing wave within the organic electroluminescent device, and the third color emitted of light by each emitting layer generates a second standing wave within the organic electroluminescent device, such that the intensities of the second color of light and the third color of light are enhanced, and the second color of light and the third color of light are mixed with the first color of light to produce a white emission.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Embodiments of the invention provide an organic electroluminescent device and an image display system employing the same. Due to the microcavity effect, the organic electroluminescent device of the invention can produce a white emission with emitting layers with the same material.

The following description is of the best-contemplated mode of carrying out the invention. This description is made for the purpose of illustrating the general principles of the invention and should not be taken in a limiting sense. The scope of the invention is best determined by reference to the appended claims.

Figure 1:
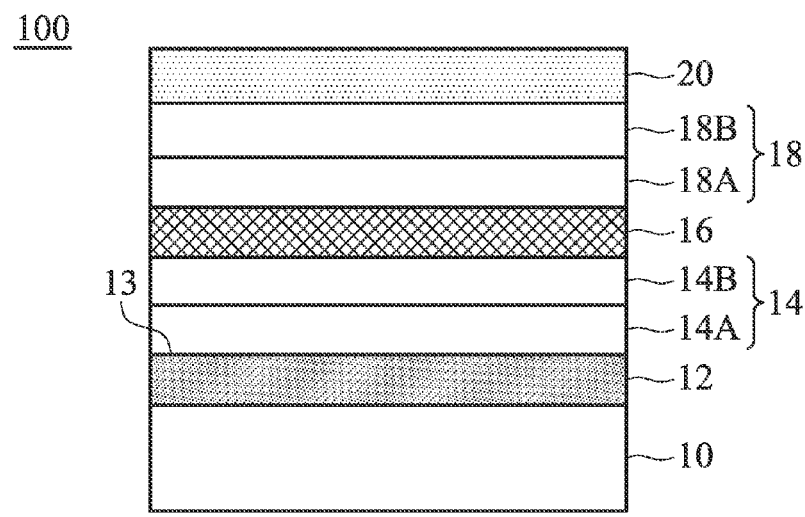
FIG. 1 is a schematic cross section of an organic electroluminescent device according to an embodiment of the present invention.

As shown in FIG. 1, an organic electroluminescent device 100 according to an embodiment of the invention is provided. The organic electroluminescent device 100 includes a substrate 10, wherein the substrate 10 can be a quartz substrate, a glass substrate, a ceramic substrate, or a plastic substrate. Further, the substrate 10 can be a substrate including a required element (such as a thin film transistor). The accompanying drawings illustrate the substrate 10 as a plain rectangle in order to simplify illustration.

A first electrode 12 (serving as an anode) is formed on the substrate 10, wherein the first electrode 12 can be a reflective electrode having a reflectivity of about 50-100% (such as about 90%). The reflective electrode can be an opaque metal layer which is relatively thick (such as Al, Cu, Mo, Ti, Pt, Ir, Ni, Cr, Ag, Au, W, or alloys thereof). Next, still as shown in FIG. 1, a first carrier injection/transport layer 14, a first emitting layer 16, and a second carrier injection/transport layer 18 are sequentially formed on the first electrode 12. Finally, a second electrode 20 (serving as a cathode) is formed on second carrier injection/transport layer 18. The first carrier injection/transport layer 14 can be a hole injection/transport layer, including a first hole injection layer 14A, and a first hole transport layer 14B. The second carrier injection/transport layer 18 can be an electron injection/transport layer, including a first electron transport layer 18A, and a first electron injection layer 18B. The first hole injection layer 14A, the first a hole transport layer 14B, the first electron transport layer 18A, and the first electron injection layer 18B of the invention can be organic semiconductor materials (such as an organic small molecule material, or polymer material) or organic-metallic materials, and can be formed by thermal vacuum evaporation, physical vapor deposition, chemical vapor deposition (organic small molecule material), spin coating, ink-jet printing, or screen printing (polymer material) methods. Further, the thicknesses of the first hole injection layer 14A, the first a hole transport layer 14B, the first electron transport layer 18A, and the first electron injection layer 18B are not limited and can be optionally modified by a person of ordinary skill in the field.

The second electrode 20 can be a semi-transparent electrode, wherein the light absorbance of the second electrode 20 is less than 25% (such as less than 10%). The second electrode 20 can be a semi-transparent metal layer which is relatively thin (such as Al, Cu, Mo, Ti, Pt, Ir, Ni, Cr, Ag, Au, W, or alloys thereof), or a semi-transparent layer including metal and transparent conductive materials (such as indium tin oxide (ITO), indium zinc oxide (IZO), aluminum zinc oxide (AZO), or zinc oxide (ZnO). Herein, in order to force the organic electroluminescent device 100 to produce a white emission by microcavity effect, suitable materials of the first emitting layer 16 can be an organic electroluminescent material having a larger full width at half maximum. In an embodiment, the organic electroluminescent material can have a full width at half maximum (FWHM) of more than 90 nm. Namely, the organic electroluminescent material of the first emitting layer should have a broadband wavelength range of the visible light. For example, the first emitting layer 16 can be a green organic electroluminescent material having a full width at half maximum (FWHM) more than 90 nm, or a blue organic electroluminescent material having a full width at half maximum of more than 90 nm, such as TPB (1,1,4,4-tetraphenylbutadiene), DSA-Ph(p-bis[p-N,N-diphenyl-amino-styryl]benzene), TAZ (1,2,4-triazole derivative), DSA (istyrylarylene derivatives), or BCzVB (1,4-bis[2-(3-N-ethyl-carbazoryl)vinyl]benzene. Further, the wave-length of the first emitting layer can be adjusted by doping a dopant. The dose of the dopant is not limited and can be optionally modified by a person of ordinary skill in the field. The organic electroluminescent material of the emitting layer can be fluorescent or phosphorescent materials. The method for forming the emitting layer can be by thermal vacuum evaporation, physical vapor deposition, chemical vapor deposition (organic small molecule material), spin coating, ink-jet printing, or screen printing methods.

Figure 2:
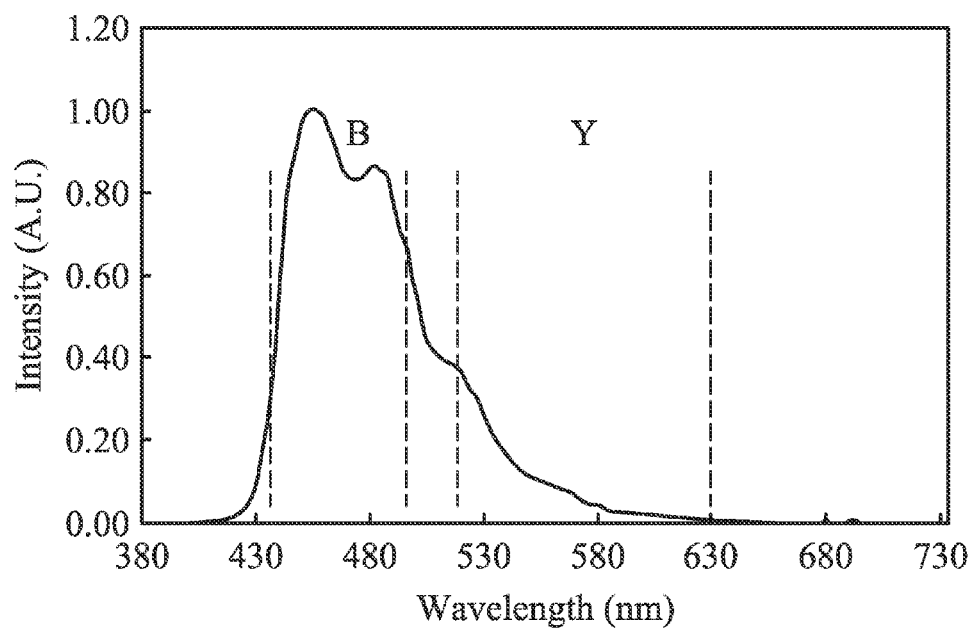
FIG. 2 is an electroluminescent photograph of a blue organic electroluminescent material employed by the electroluminescent device of FIG. 1.

FIG. 2 is an electroluminescent photograph of a blue organic electroluminescent material. As show in FIG. 2, the blue organic electroluminescent material has a major luminous intensity at 440-500 nm (i.e. the first color of light B of the blue organic electroluminescent material is blue), and the blue organic electroluminescent material also has a minor luminous intensity at 520-630 nm (i.e. the second color of light Y of the blue organic electroluminescent material is yellow). Since the second color (yellow) of light Y of the blue organic electroluminescent material has a lower luminous intensity than the first color (blue) of light B, the second color (yellow) of light Y emitted by an organic electroluminescent device employing the blue organic electroluminescent material is enhanced by microcavity effect, in order to mix the first color (blue) of light B and the second color (yellow) of light Y to produce white emission. Accordingly, due to the reflective electrode 12 and the semi-transparent electrode 20, the second color (yellow) of light Y emitted by the first emitting layer 16 generates a standing wave within the organic electroluminescent device 100. Further, in order to enhance the emitting layer 16 of the second color of light Y, the first emitting layer 16 has to be disposed at an antinode of the standing wave.

When the first emitting layer 16 is disposed at a location near to the antiode of the standing wave with the organic electroluminescent device 100, the luminous intensity of the second color of light Y can be enhanced by microcavity effect according to the Fabry-Perot equation. It should be noted that, the thickness of the first carrier injection/transport layer 14 (such as hole injection/transport layer), and the second carrier injection/transport layer 18 (such as electron injection/transport layer) can be optionally adjusted in order to force the location of the first emitting layer 16 to be near to the antinode of the standing wave. However, the recombination region of the electrons and holes would also be moved when adjusting the thickness of the carrier injection/transport layer. In order to maintain the recombination region of the electrons and holes within the first emitting layer 16, the thickness of the first hole transport layer 14B, the thickness of the first emitting layer thickness, the thickness of first electron transport layer 18A, and thickness of first electron injection layer 18B are fixed, and only the thickness of the first hole injection layer 14A (with a relatively high hole mobility) is adjusted. For example, the thickness of the first hole transport layer 14B can be of between 50-200 Å (such as 100 Å), the thickness of the first emitting layer thickness can be of between 100-400 Å (such as 250 Å), the thickness of the first electron transport layer 18A and the electron injection layer 18B can be of between 300-700 Å (the thickness of the first electron transport layer 18A can be 200 Å, and the thickness of the first electron injection layer 18B can be 100 Å).

Figure 3:
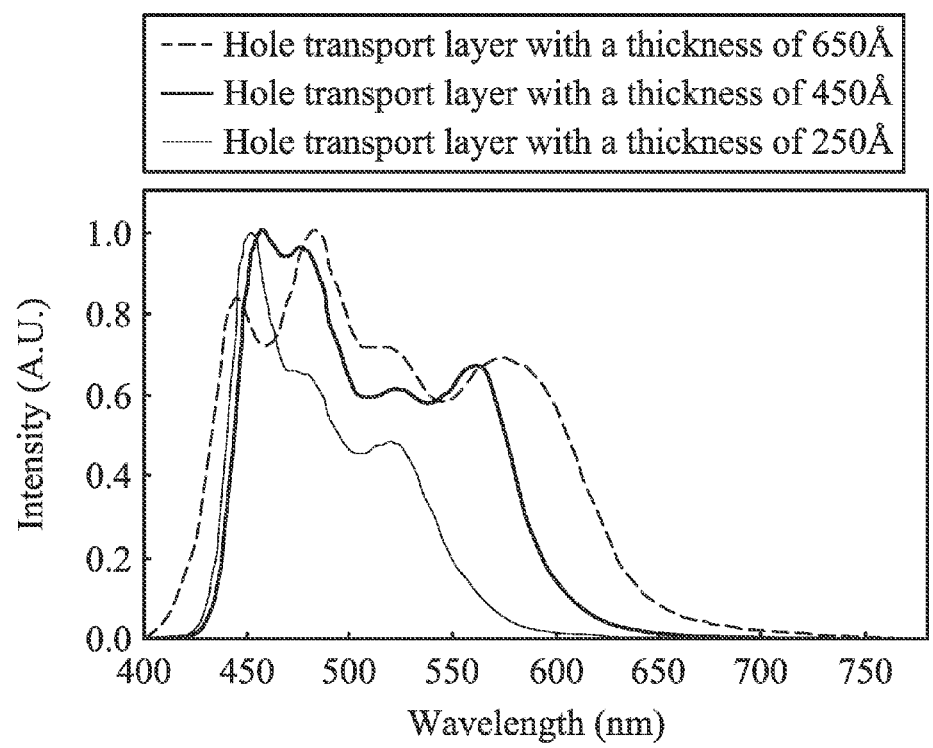
FIG. 3 is an electroluminescent photograph of the organic electroluminescent devices having the first hole injection layer with various thicknesses.
Figure 4:
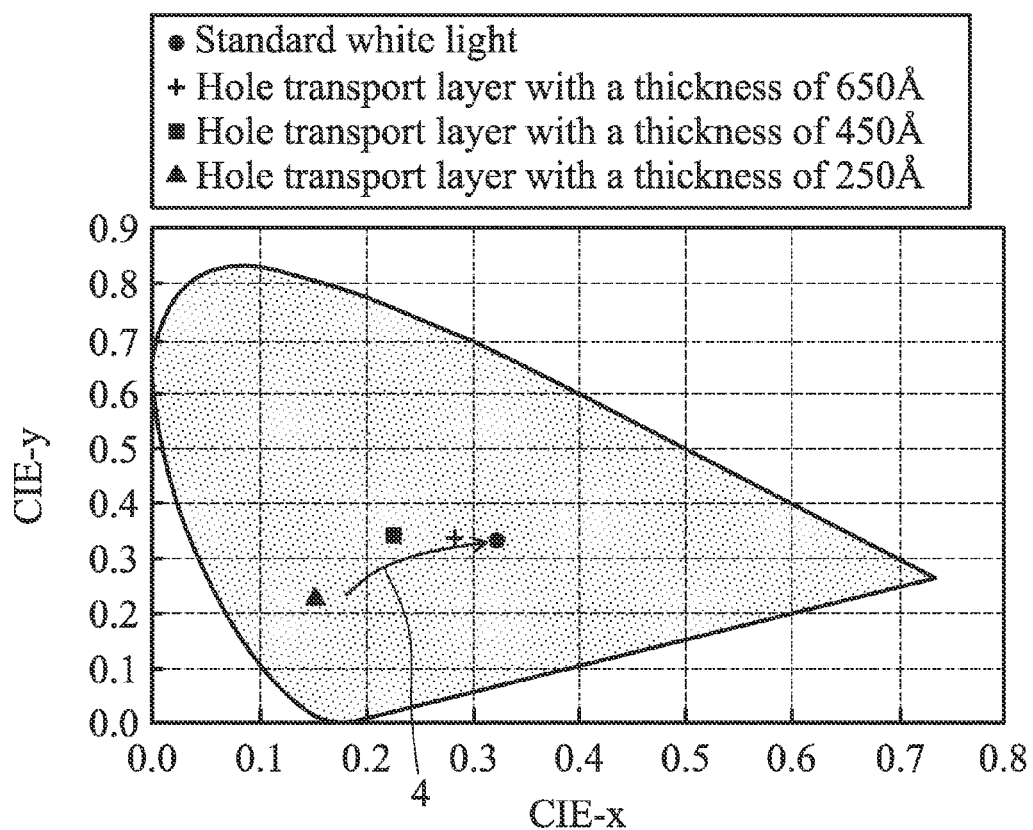
FIG. 4 shows a CIE coordination comparison diagram of the organic electroluminescent devices having the first hole injection layer with different thicknesses.

FIG. 3 is an electroluminescent photograph of the organic electroluminescent devices 100 with various thicknesses of the first hole injection layer 14A. When the first hole injection layer 14A has a thickness of 250 Å, the relative luminous intensity of the second color of light Y of the organic electroluminescent device 100 is less than 0.2, and the organic electroluminescent device 100 has a blue emission. As shown in FIG. 4, the CIE coordination of the organic electroluminescent device 100 (with the first hole injection layer 14A having a thickness of 250 Å) is close to the CIE coordination of a blue light. When the first hole injection layer 14A has a thickness of 450 Å, the relative luminous intensity of the second color of light Y of the organic electroluminescent device 100 is increased to 0.6, as shown in FIG. 3. Meanwhile, the CIE coordination of the organic electroluminescent device 100 (with the first hole injection layer 14A having a thickness of 450 Å) is close to the CIE coordination of a green light (as shown in FIG. 4), since the first emitting layer 16 is more close to the antinode of the antinode of the second color of light Y.

When the first hole injection layer 14A has a thickness of 650 Å, the relative luminous intensity of the second color of light Y (with a wavelength of 520-630 nm) of the organic electroluminescent device 100 is increased to about 0.7, as shown in FIG. 3. Meanwhile, the CIE coordination of the organic electroluminescent device 100 (with the first hole injection layer 14A having a thickness of 650 Å) is close to the CIE coordination (0.33, 0.33) of a white light (as shown in FIG. 4), since the first emitting layer 16 is substantially disposed at the antinode (separated by a vertical distance about 750 Å from a top surface 13 of the first electrode 12 and calculated via Fabry-Perot equation) of the second color of light Y.

Herein, when the thickness of the first hole injection layer 14A is increased to over 650 Å, the blue color of light B of the organic electroluminescent device 100 is increased gradually. Since the first emitting layer 16 is positioned away from the antinode gradually, the organic electroluminescent device 100 produces a white emission again until the first emitting layer 16 is close to the next antinode of the standing wave (separated by a vertical distance of about 1870 Å from a top surface 13 of the first electrode 12 and calculated via the Fabry-Perot equation).

Accordingly, the thickness of the first carrier injection/transport layer 14 (including the first hole injection 14A and first a hole transport layer 14B) can be from 650 to 850 Å, or from 1750 to 1950 Å, thereby causing the organic electroluminescent device 100 with a blue emitting layer to produce a white emission.

Figure 5:
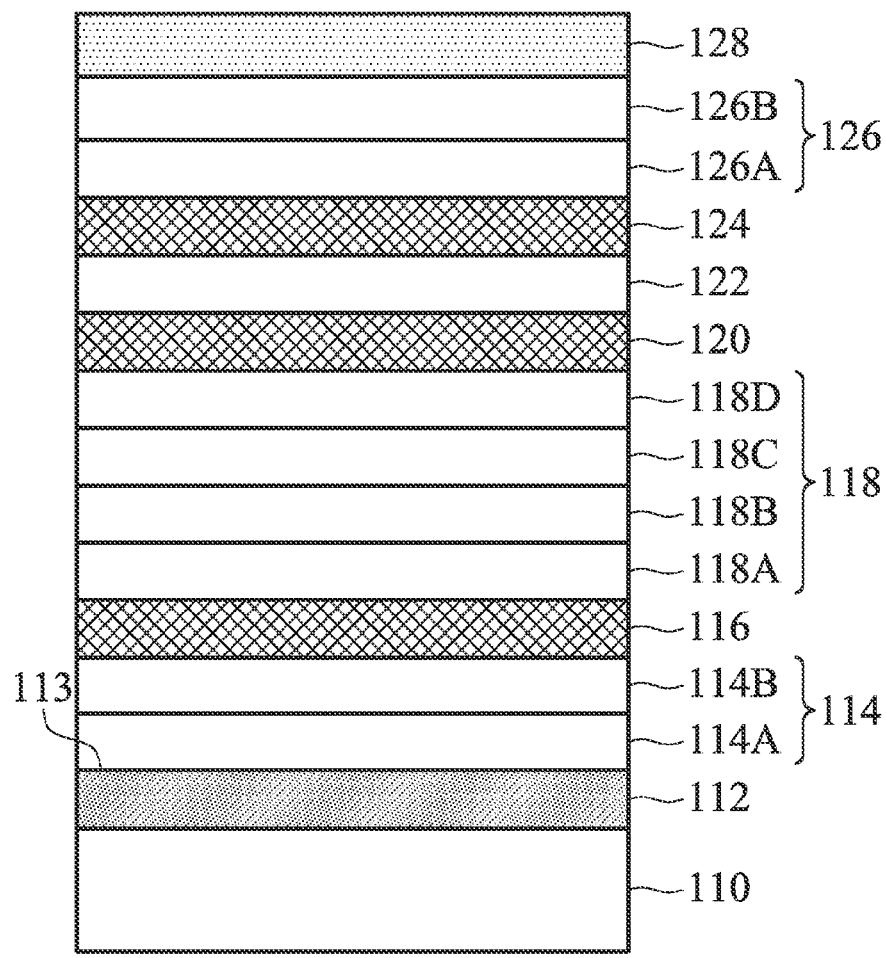
FIG. 5 is a schematic cross section of an organic electroluminescent device according to another embodiment of the present invention.

As shown in FIG. 5, an organic electroluminescent device 200 according to another embodiment of the invention is provided. Particularly, the organic electroluminescent device 200 includes three identical emitting layers in order to produce a white emission. The organic electroluminescent device 200 includes a substrate 110, and a first electrode 112 (serving as an anode) formed on substrate 110. Next, a first carrier injection/transport layer 114 (such as a hole injection/transport layer including a first hole injection layer 114A, and a first a hole transport layer 114B), a first emitting layer 116, a first spacer layer 118, a second emitting layer 120, a second spacer layer 122, a third emitting layer 124, and a second carrier injection/transport layer 126 (such as an electron injection/transport layer including a first electron transport layer 126A and a first hole injection layer 126B) are sequentially formed on first electrode 112. Finally, a second electrode 128 (serving as a cathode) is formed on second carrier injection/transport layer 126. Particularly, the substrate, the first electrode, the carrier injection/transport layer, and the second electrode have the same definitions as described above. The first spacer layer 118, for example, can include a second electron transport layer 118A, a second electron injection layer 118B, a connecting layer 118C, and a second hole transport layer 118D. The second spacer layer 12 can be a third hole transport layer, wherein the connecting layer 118C can be an n-type or p-type connecting layer, such as Alq:Li/MoO$_3$.

It should be noted that, in this embodiment, the first emitting layer 116, the second emitting layer 120, and the third emitting layer 124 are formed by the same material, thereby reducing the process complexity of the organic electroluminescent device 200.

In order to force the organic electroluminescent device 200 to produce a white emission by microcavity effect, suitable materials of the first emitting layer 116, the second emitting layer 120, and the third emitting layer 124 can be an organic electroluminescent material having a larger full width at half maximum. Namely, the organic electroluminescent material can have a full width at half maximum (FWHM) of more than 90 nm. In an embodiment, the organic electroluminescent material of the first emitting layer 116, the second emitting layer 120, and the third emitting layer 124 should have a broadband wavelength range of the visible light (including red, green, and blue color).

For example, the first emitting layer 116, the second emitting layer 120, and the third emitting layer 124 can be a green organic electroluminescent material having a full width at half maximum of more than 90 nm, such as Alq$_3$ (8-Hydroxyquinoline aluminum salt), and fac-tris(2-phenyl pyridine) iridium (Ir(ppy)$_3$). Further, the wave-length of the first emitting layer can be adjusted by doping a dopant. The dose of the dopant is not limited and can be optionally modified by a person of ordinary skill in the field. Moreover, the first emitting layer 116, the second emitting layer 120, and the third emitting layer 124 can be fluorescent or phosphorescent material. The method for forming the emitting layer can be thermal vacuum evaporation, physical vapor deposition, chemical vapor deposition (organic small molecule material), spin coating, ink-jet printing, or screen printing methods.

In this embodiment, since the first emitting layer 116, the second emitting layer 120, and the third emitting layer 124 is a green organic electroluminescent material having a full width at half maximum, the luminous intensity of the blue color of light and the red color of light of the organic electroluminescent device 200 should be enhanced in order to force the organic electroluminescent device 200 to produce a white emission.

For example, in this embodiment, the first electrode 112 serves as a reflective electrode, and the second electrode 128 serves as a semi-transparent electrode, thereby they form a microcavity. The blue color of light and the red color of light generate, respectively, a blue light standing wave and a red light standing wave. The second emitting layer 120 and the third emitting layer 124 are disposed respectively at the antinode of the blue light standing wave and the red light standing wave, such that the blue light and the red light within the organic electroluminescent device 200 perform a constructive interference and the green light within the organic electroluminescent device 200 performs a destructive interference. Therefore, the luminous intensity of the blue light and the red light is enhanced, and the luminous intensity of the green light is reduced, resulting in the organic electroluminescent device 200 to produce a white emission.

In this embodiment, the locations of the antinode of the blue light standing wave and the red light standing wave are measured according to the Fabry-Perot equation. The second emitting layer 120 and third emitting layer 124 are disposed to be close to the antinodes of the blue light standing wave and the red light standing wave, respectively.

Figure 6:
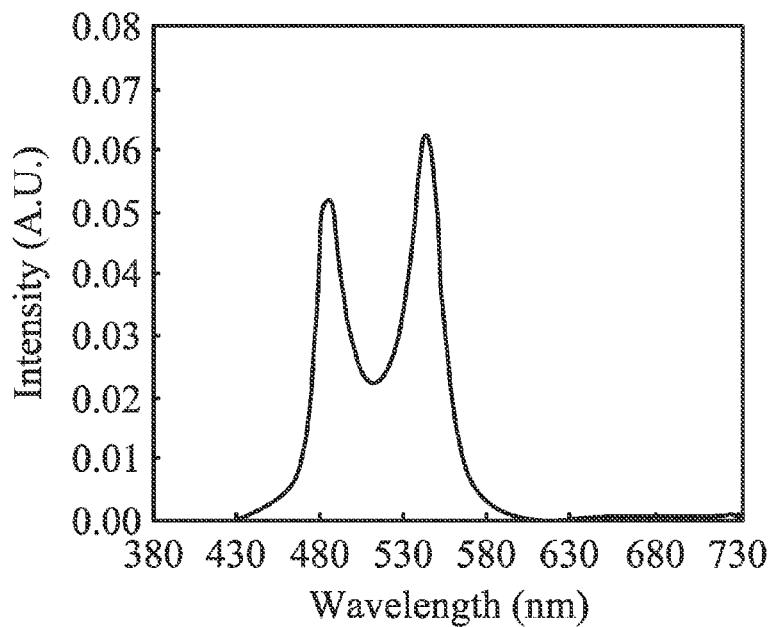
FIG. 6 is an electroluminescent photograph of the first emitting layer of the organic electroluminescent device as shown in FIG. 5.
Figure 7:
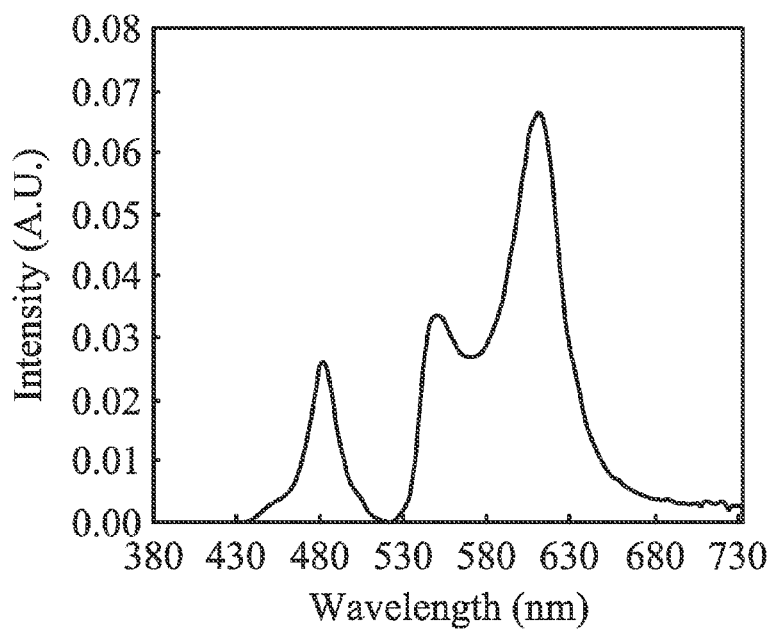
FIG. 7 is an electroluminescent photograph of the second emitting layer of the organic electroluminescent device as shown in FIG. 5.
Figure 8:
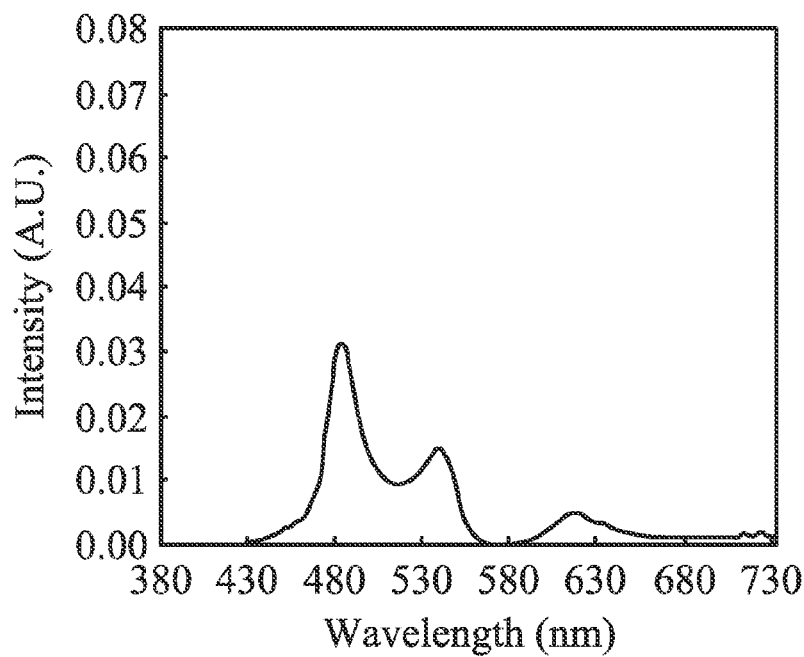
FIG. 8 is an electroluminescent photograph of the third emitting layer of the organic electroluminescent device as shown in FIG. 5.

For example, the thickness of the first carrier injection/transport layer 114 (including the first hole injection layer 114A and the first a hole transport layer 114B) is controlled to be between about 1200-1600 Å, such that the first emitting layer 116 is separated by a vertical distance of about 1200-1600 Å (such as 1400 Å) from a top surface 113 of the first electrode 112. Therefore, the first emitting layer 116 has a major luminous intensity at 550 nm (a green emission) and a minor luminous intensity at 480 nm (a blue emission), as shown in FIG. 6. The thickness of the first carrier injection/transport layer 114 (including the first hole injection layer 114A and the first a hole transport layer 114B), the first emitting layer 116, and first spacer layer 118 is controlled to be between about 2300-2550 Å, such that the second emitting layer 120 is disposed at the antinode of the red light standing wave and separated by a vertical distance about 2300-2550 Å (such as 2480 Å) from a top surface 113 of the first electrode 112. Therefore, since the luminous intensity of the red light is increased and the luminous intensity of the green light is reduced, the second emitting layer 120 has a major luminous intensity at 580-650 nm (a red emission), as shown in FIG. 7;

The thickness of the first carrier injection/transport layer 114 (including the first hole injection layer 114A and the first a hole transport layer 114B), the first emitting layer 116, the first spacer layer 118, the second emitting layer 120, and the second spacer layer 122 are controlled to be between about 2650-2950 Å, such that the third emitting layer 124 is disposed at the antinode of the blue light standing wave and separated by a vertical distance about 2650-2950 Å (such as 2762 Å) from a top surface 113 of the first electrode 112. Therefore, since the luminous intensity of the blue light is increased and the luminous intensity of the green light is reduced, the third emitting layer 124 has a major luminous intensity at 440-500 nm (a blue emission), as shown in FIG. 8.

Figure 9:
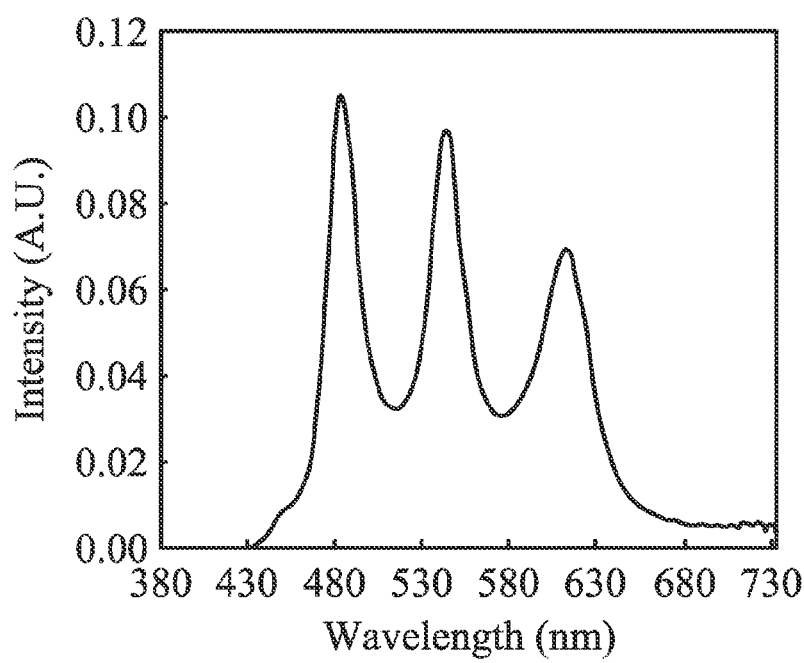
FIG. 9 is an electroluminescent photograph of the organic electroluminescent device as shown in FIG. 5.

Accordingly, since the first emitting layer 116, the second emitting layer 120, and the third emitting layer 124 emit a green emission, a red emission, and a blue emission respectively, the organic electroluminescent device 200 produces a white emission after mixing the green emission as shown in FIG. 9, the red emission, and the blue emission. Therefore, the invention provides a white color organic electroluminescent device by merely employing a single organic electroluminescent material.

Figure 10:
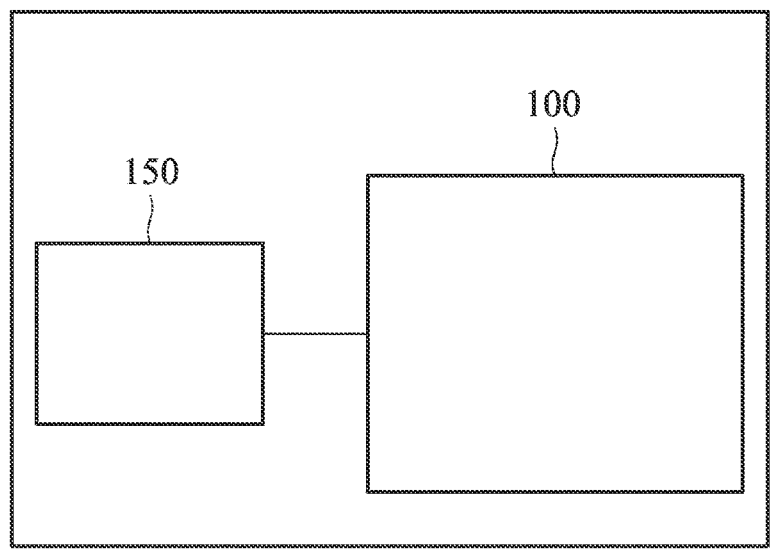
FIG. 10 schematically shows an image display system including the organic electroluminescent devices of the invention.

As shown in FIG. 10, the image display system 300 including the organic electroluminescent device 100 (or 200) according to an embodiment of the invention is shown. The image display system 300 can be an electric device such as a notebook computer, mobile phone, digital camera, personal data assistant (PDA), desktop computer, television, car display, or portable DVD player. The image display system 300 of the invention includes the organic electroluminescent device 100 (or 200) and an input unit 150 coupled to the organic electroluminescent device 100 (or 200). The input unit 150 is operative to provide input to the organic electroluminescent device 100 (or 200), such that the organic electroluminescent device 100 (or 200) displays images.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image display system, comprising:
an organic electroluminescent device, comprising:
a substrate;
a first electrode formed on the substrate;
a first emitting layer formed on the first electrode, wherein the first emitting layer emits a first color of light, and a second color of light;
a first hole injection layer and a first a hole transport layer disposed between the first electrode and the first emitting layer, wherein the thickness of the first hole injection layer and the first a hole transport layer is of between 650~850 Å, or 1750~1950 Å;
a second electrode formed on the first emitting layer, wherein the second color of light emitted by the first emitting layer generates a first standing wave within the organic electroluminescent device, and the first emitting layer is disposed at an antinode of the first standing wave, such that the intensity of the second color of light is enhanced, and the second color of light is mixed with the first color of light to produce a white emission.

2. The image display system as claimed in claim 1, wherein the first emitting layer has a full width at half maximum of more than 90 nm.

3. The image display system as claimed in claim 1, wherein the first color of light is blue, and the second color of light is yellow.

4. The image display system as claimed in claim 1, further comprising a first electron transport layer, and a first electron injection layer disposed between the first emitting layer and the second electrode.

5. The image display system as claimed in claim 1, wherein the first electrode is a reflective electrode.

6. The image display system as claimed in claim 1, wherein the second electrode is a semi-transparent electrode.

7. The image display system as claimed in claim 6, wherein the semi-transparent electrode has a light absorbance of less than 25%.

8. The image display system as claimed in claim 1, further comprising a first spacer layer, a second emitting layer, a second spacer layer, a third emitting layer, a first electron transport layer, and a first electron injection layer disposed between the first emitting layer and the second electrode, wherein the first spacer layer, the second emitting layer, the second spacer layer, the third emitting layer, the first electron transport layer, and the first electron injection layer are sequentially formed on the first emitting layer.

9. The image display system as claimed in claim 8, wherein the first emitting layer, the second emitting layer, and the third emitting layer are formed by the same material, and each emitting layer emits the first color of light, the second color of light, and a third color of light simultaneously.

10. The image display system as claimed in claim 9, wherein the third color of light emitted by each emitting layer generates a second standing wave within the organic electroluminescent device, and the second emitting layer, or the third emitting layer is disposed at an antinode of the second standing wave.

11. The image display system as claimed in claim 8, wherein the full widths at half maximum of the first emitting layer, the second emitting layer, and the third emitting layer are larger than 90 nm.

12. The image display system as claimed in claim 9, wherein the first color of light is green, the second color of light is blue, and the third color of light is red.

13. The image display system as claimed in claim 8, wherein the first spacer layer comprises a second electron transport layer, a second electron injection layer, a connecting layer, and a second hole transport layer.

14. The image display system as claimed in claim 8, wherein the second spacer layer comprises a third hole transport layer.

15. An image display system, comprising:
an organic electroluminescent device, comprising:
a substrate;
a first electrode formed on the substrate;
a first hole injection layer, a first a hole transport layer, a first emitting layer, a first spacer layer, a second emitting layer, a second spacer layer, a third emitting layer, a first electron transport layer, and a first electron injection layer sequentially formed on the first electrode, wherein the first emitting layer, the second emitting layer, and the third emitting layer are formed by the same material, and each emitting layer emits a first color, a second color, and a third color of light; and
a second electrode formed on the first electron injection layer, wherein the second color of light emitted by each emitting layer generates a first standing wave within the organic electroluminescent device, and the third color of light emitted by each emitting layer generates a second standing wave within the organic electroluminescent device, such that the intensities of the second color of light and the third color of light are enhanced, and the second color of light and the third color of light are mixed with the first color of light to produce a white emission.

16. The image display system as claimed in claim 15, wherein the full widths at half maximum the first emitting layer, the second emitting layer, and the third emitting layer are larger than 90 nm.

17. The image display system as claimed in claim 15, wherein the first color is green, the second color is blue, and the third color of light is red.

18. The image display system as claimed in claim 15, wherein the thickness of the first hole injection layer, and the first a hole transport layer is of between 1200-1600 Å, the thickness of the first hole injection layer, the first a hole transport layer, the first emitting layer, and the first spacer layer is of between 2300-2550 Å, and the thickness of the first hole injection layer, the first a hole transport layer, the first emitting layer, the first spacer layer, the second emitting layer, and the second spacer layer is of between 2650-2950 Å.

* * * * *